US011742613B2

(12) United States Patent
Lewis et al.

(10) Patent No.: US 11,742,613 B2
(45) Date of Patent: Aug. 29, 2023

(54) FLOATING AUTO-CENTERING CABLE CONNECTOR ASSEMBLY

(71) Applicant: DELL PRODUCTS, LP, Round Rock, TX (US)

(72) Inventors: Jeffrey M. Lewis, Maynard, MA (US); Stephen Strickland, Foxborough, MA (US)

(73) Assignee: Dell Products L.P., Round Rock, TX (US)

( * ) Notice: Subject to any disclaimer, the term of this patent is extended or adjusted under 35 U.S.C. 154(b) by 115 days.

(21) Appl. No.: 17/197,489

(22) Filed: Mar. 10, 2021

(65) Prior Publication Data

US 2022/0294160 A1    Sep. 15, 2022

(51) Int. Cl.
*H01R 13/631*  (2006.01)
*H05K 7/14*  (2006.01)
*H01R 13/74*  (2006.01)

(52) U.S. Cl.
CPC ....... *H01R 13/6315* (2013.01); *H01R 13/748* (2013.01); *H05K 7/1491* (2013.01); *H01R 2201/06* (2013.01)

(58) Field of Classification Search
CPC .............. H01R 13/6315; H01R 13/748; H01R 2201/06; H05K 7/1491
USPC ........................................ 439/248, 565, 555
See application file for complete search history.

(56) References Cited

U.S. PATENT DOCUMENTS

| | | | | |
|---|---|---|---|---|
| 5,397,244 A | * | 3/1995 | Generoli | B64G 1/641 |
| | | | | 439/248 |
| 5,552,959 A | * | 9/1996 | Penniman | G06F 1/1616 |
| | | | | 361/679.41 |
| 7,059,882 B2 | * | 6/2006 | Sugita | H01R 13/6315 |
| | | | | 439/247 |
| 7,090,521 B2 | * | 8/2006 | Nishio | H01R 13/6315 |
| | | | | 439/248 |
| 7,121,857 B1 | * | 10/2006 | Lewis | H01R 13/6315 |
| | | | | 439/247 |
| 8,342,866 B2 | * | 1/2013 | Taylor | H01R 13/637 |
| | | | | 439/248 |
| 8,550,831 B2 | * | 10/2013 | Nishijima | H01R 13/518 |
| | | | | 439/248 |
| 8,585,421 B2 | * | 11/2013 | Yamaguchi | H01R 13/05 |
| | | | | 439/248 |
| 9,017,087 B1 | * | 4/2015 | Rossman | H01R 13/73 |
| | | | | 439/248 |
| 9,116,170 B2 | * | 8/2015 | Guo | G01R 1/0416 |
| 9,810,422 B2 | | 11/2017 | Su et al. | |
| 10,998,742 B2 | * | 5/2021 | Yu | H02J 7/0042 |
| 11,258,216 B2 | * | 2/2022 | Hitchcock | H01R 13/52 |

(Continued)

FOREIGN PATENT DOCUMENTS

CN       105655806 A  *  6/2016  .......... G02B 6/3821

*Primary Examiner* — Marcus E Harcum
(74) *Attorney, Agent, or Firm* — Larson Newman, LLP

(57) ABSTRACT

A floating connector assembly for an information handling system includes a first float bracket and a connector. The first float includes a bar. The connector includes a first receptacle and a first compressible component. The first compressible component is placed in physical communication with the bar of the first float bracket. In response to a force exerted on the connector, a region of the first compressible component is compressed. The connector floats with respect to the first float bracket in a direction of the force exerted on the connector.

20 Claims, 6 Drawing Sheets

(56) References Cited

U.S. PATENT DOCUMENTS

| | | | |
|---|---|---|---|
| 2011/0250773 A1* | 10/2011 | Hamner | H01R 13/6315 |
| | | | 439/248 |
| 2017/0257980 A1* | 9/2017 | Fukunaga | F16L 37/40 |
| 2019/0011950 A1* | 1/2019 | Shaw | H01F 7/0205 |
| 2020/0359518 A1 | 11/2020 | Chang et al. | |
| 2021/0376527 A1* | 12/2021 | Cheng | H01R 13/6315 |
| 2021/0376528 A1* | 12/2021 | Pao | H01R 13/6315 |

\* cited by examiner

FLOATING AUTO-CENTERING CABLE CONNECTOR ASSEMBLY

FIELD OF THE DISCLOSURE

The present disclosure generally relates to information handling systems, and more particularly relates to a floating auto-centering cable connector assembly.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A floating connector assembly for an information handling system includes a first float bracket and a connector. The first float includes a bar. The connector includes a first receptacle and a first compressible component. The first compressible component may be placed in physical communication with the bar of the first float bracket. In response to a force exerted on the connector, a region of the first compressible component may be compressed. The connector may float with respect to the first float bracket in a direction of the force exerted on the connector.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
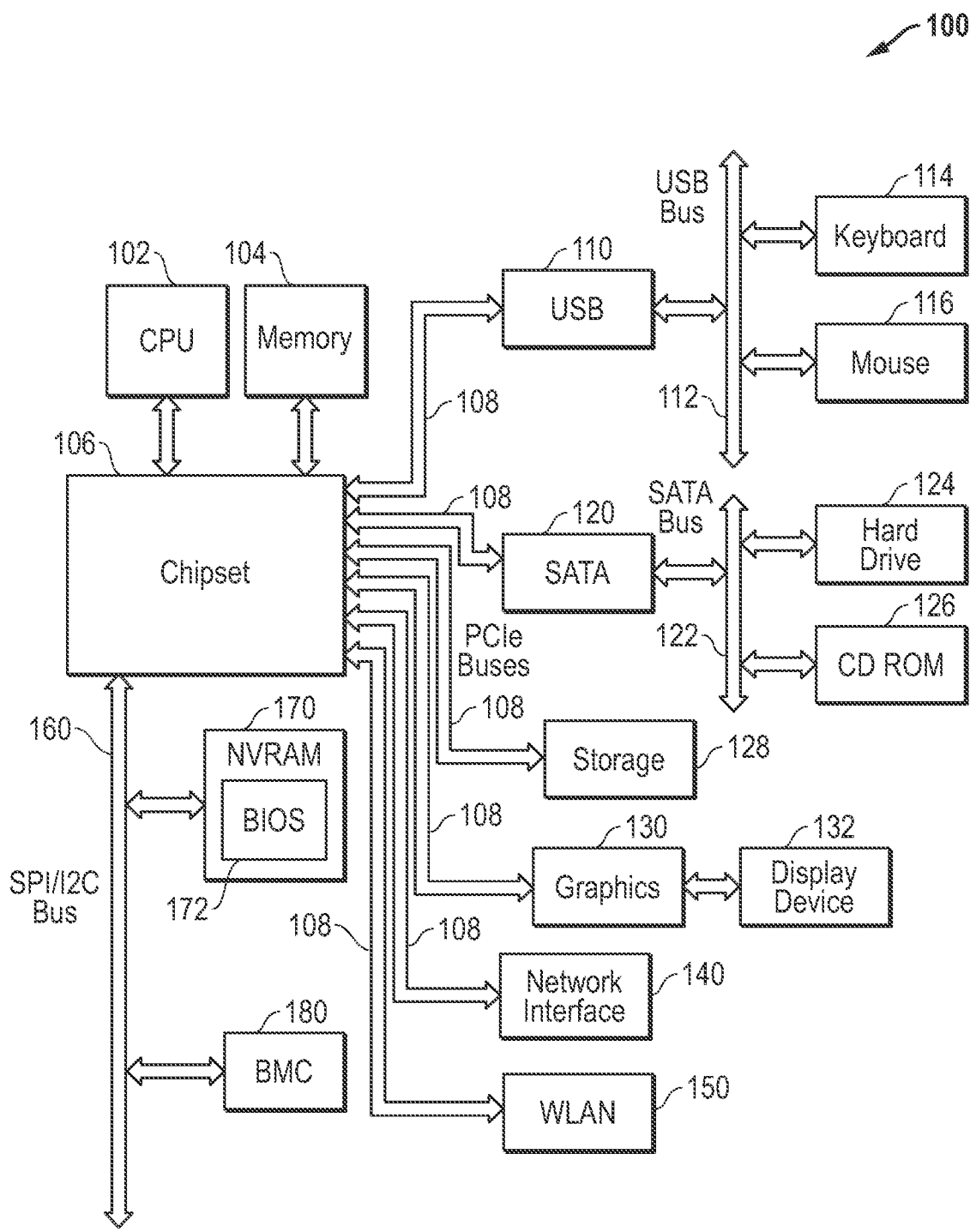
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 includes a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor. System 100 may include any additional components over those shown in FIG. 1 without varying from the scope of this disclosure.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
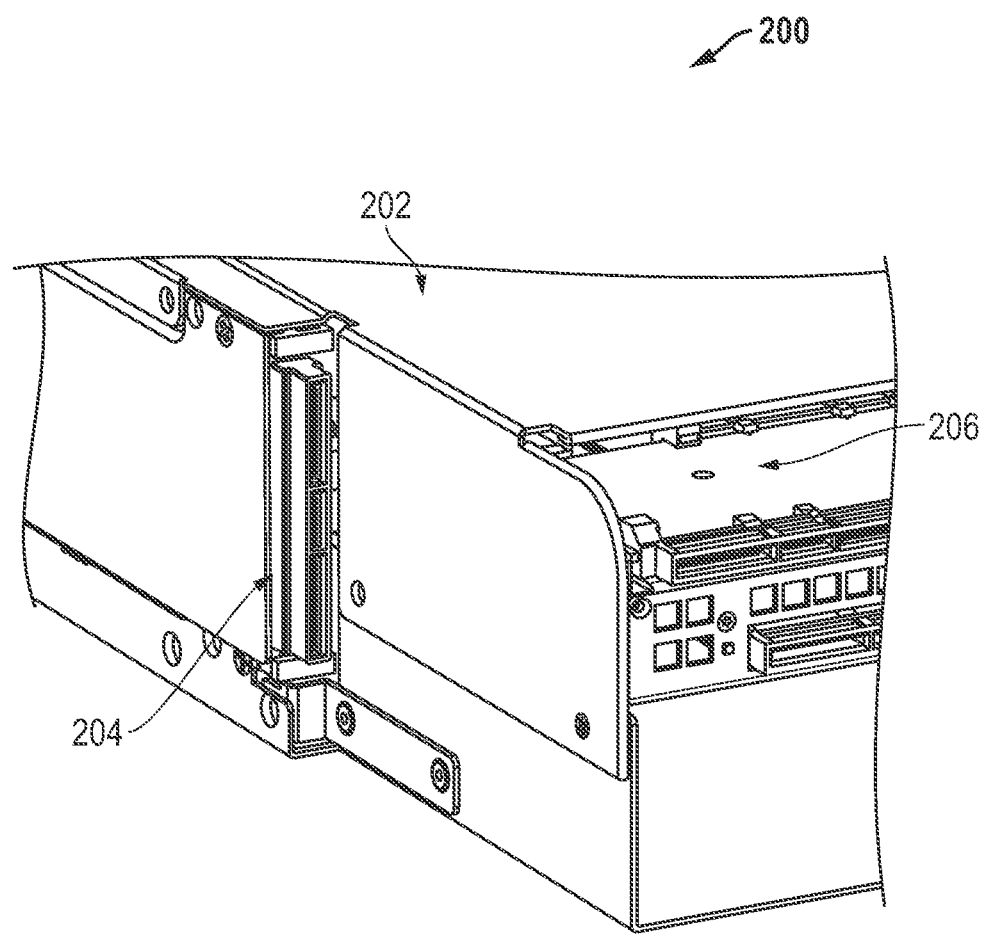
FIG. 2 is a diagram of an information handling system with a floating connector assembly according to at least one embodiment of the disclosure.

In an example, information handling system 100 may be any suitable device including, but not limited to, information handling system 202 of FIG. 2. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates an information handling system 200 according to at least one embodiment of the disclosure. Information handling system 200 includes a cover 202, a floating connector assembly 204, and a midplane 206. Cover 202 may provide a cosmetic look to information handling system 200 while allowing access to floating connector assembly 204. In an example, information handling system 200 may be a server or any other similar device. In certain examples, floating connector assembly 204 may be mounted on any suitable component of information handling system 200 including, but not limited to, a compute board, such as compute node 304 of FIG. 3, and a fixed midplane 206. Information handling system 200 may include additional components over those described herein without varying from the scope of the disclosure.

In an example, if floating connector assembly 204 is mounted on a midplane a compute node may be plugged into one side of the floating connector assembly and a pluggable input/output (10) module may plug into the other side of the floating connector assembly. In this example, floating connector assembly 204 may be fixed reference point for each pluggable device to mate with. Floating connector assembly 204 may improve information handling system 200 by the floating connector assembly including tolerances in multiple directions to enable devices with different alignments to plug into the floating connector assembly. For example, floating connector assembly 204 may enable a single field replaceable unit (FRU) to be plugged into the floating connector assembly within information handling system 200, and multiple different FRUs to be plugged in the floating connector assembly from outside of the information handling system. In this example, the multiple different FRUs may have slightly different tolerances and floating connector assembly 204 may adjust to accommodate the different FRUs to be plugged into the floating connector assembly.

Figure 3:
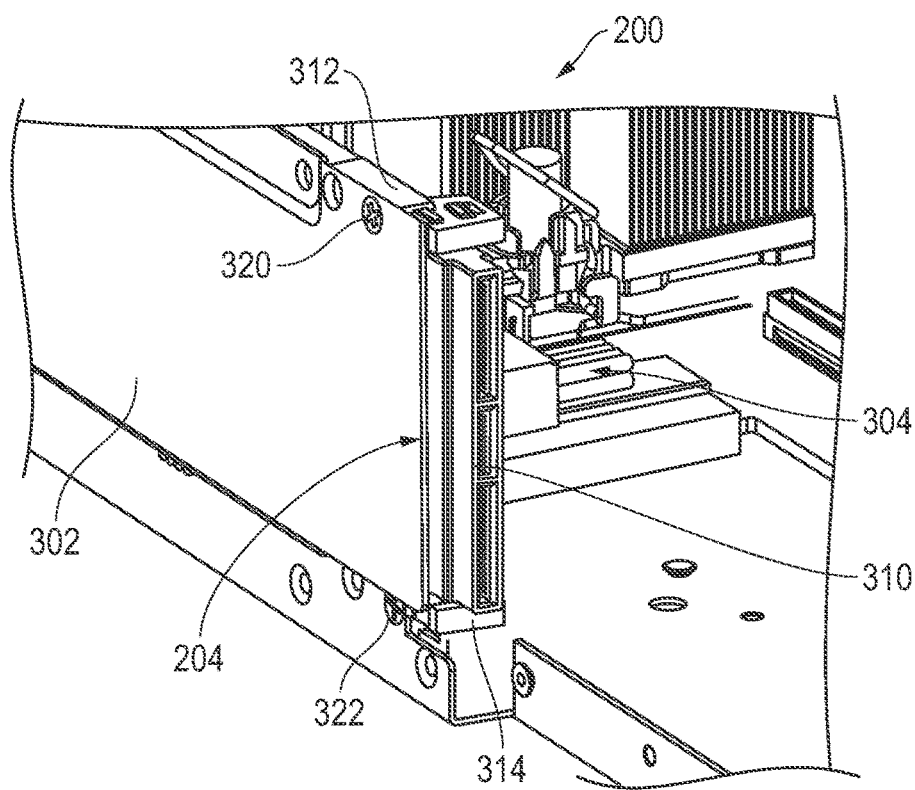
FIG. 3 is a diagram of the information handling system with a cover removed to show particular components of the floating connector assembly according to at least one embodiment of the disclosure.
Figure 4:
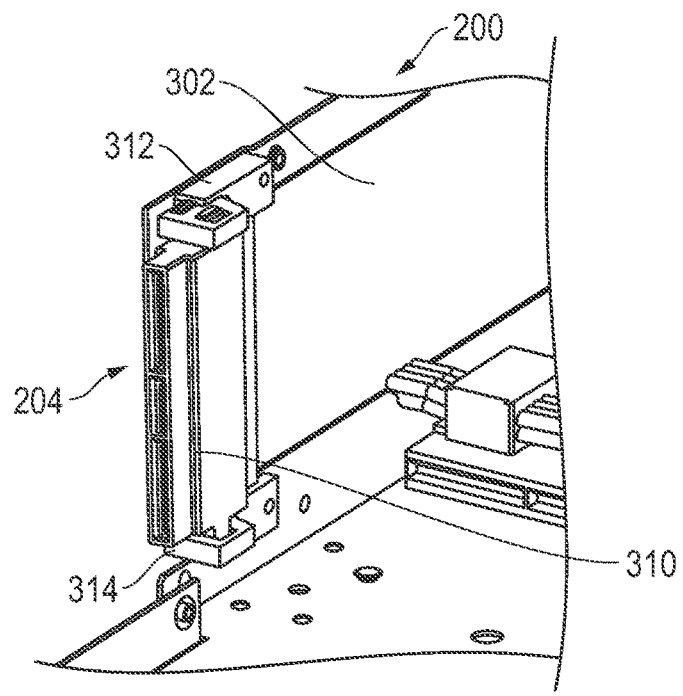
FIG. 4 is a diagram of the information handling system showing a different view of the particular components of the floating connector assembly according to at least one embodiment of the present disclosure.

FIGS. 3 and 4 illustrate different views of floating connector assembly 204 mounted on a side cover 302 of information handling system 200 according to at least one embodiment of the disclosure. Floating connector assembly 204 includes connector 310 and float brackets 312 and 314. Connector 310 may be placed in physical communication with both float brackets 312 and 314. In an example, one end of connector 310 may be in physical communication with float bracket 312 while the other distal end of the connector may be in physical communication with float bracket 314.

Floating connector assembly 204 may be secured to side cover 302 of information handling system 200 in any suitable manner. For example, a screw or mounting component 320 may physically and securely attach float bracket 312 to side cover 302, and a screw or mounting component 322 may physically and securely attach float bracket 314 to the side cover. In an example, float brackets 312 and 314 may be secured to side cover 302, but connector 310 may be able to move with respect to the float brackets and the side cover. Floating connector assembly 204 will be described in more detail with respect to FIGS. 5-9 below.

Figure 5:
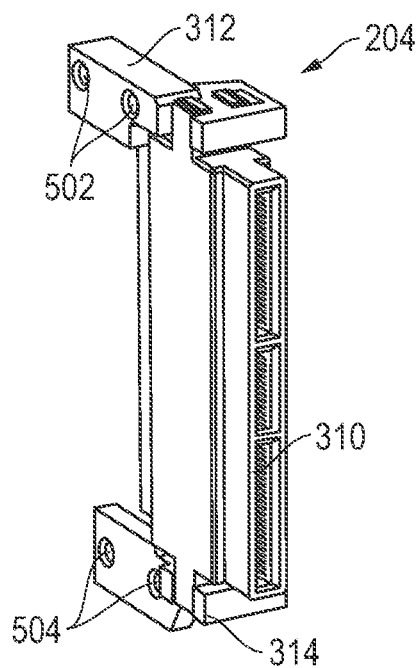
FIG. 5 is a diagram of the floating connector assembly according to at least one embodiment of the present disclosure.

FIGS. 5-9 illustrate different views of floating connector assembly 204 according to at least one embodiment of the present disclosure. Floating connector assembly 204 includes connector 310 and float brackets 312 and 314. Referring to FIG. 5, float bracket 312 includes mounting holes 502. One or more of mounting holes 502 may interface with one or more screws, such as screw 320 of FIG. 3, to secure float bracket 312 to side cover 302 of FIG. 3. Similarly, float bracket 314 includes mounting holes 504. One or more of mounting holes 504 may interface with one or more screws, such as screw 322 of FIG. 3, to secure float bracket 314 to side cover 302 of FIG. 3.

Figure 6:
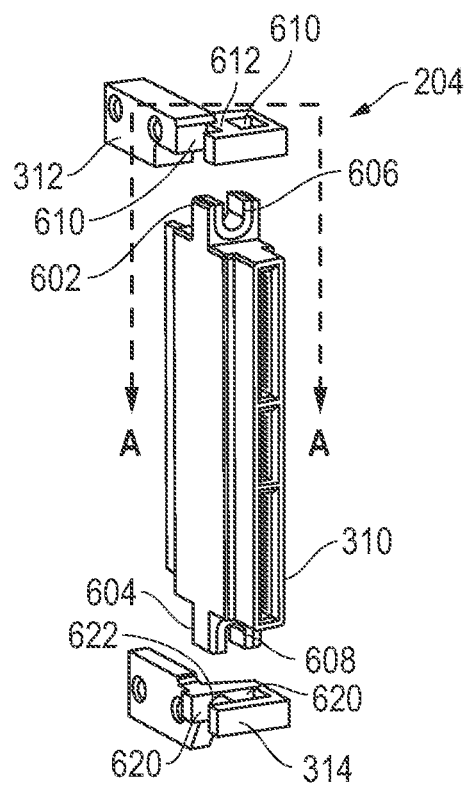
FIG. 6 is a diagram of the floating connector assembly with floating brackets separated from a cable connector according to at least one embodiment of the present disclosure.

Referring now to FIG. 6, connector 310 includes receptacles 602 and 604, and compressible components 606 and 608. In certain examples, receptacles 602 and 604 may be in any suitable shape capable of interfacing with float brackets 312 and 314. For example, receptacles 602 and 604 may be any open shape including, but not limited to, a 'U' shape. In an example, each of receptacles 602 and 604 include an end attached to connector 310 and another end, the end distal from the first end, that is the open shape. The open shape of receptacles 602 and 604 may allow connector 310 to float or move in two directions while providing a rigid surface to prevent movement in a third direction.

In an example, receptacles 602 and 604 may be lined with respective compressible components 606 and 608. Compressible components 606 and 608 may be any suitable material capable of being compressed when a force is applied and may reform to its original shape when the force is removed. For example, compressible components 606 and 608 may be a foam, a metal mesh, soft rubber, or the like. In an example, an amount or distance that connector 310 may float in the two directions may substantially correspond to an amount that compressible components 606 and 608 may be compressed. Compressible components 606 and 608 may provide an auto-centering of connector 310 based on the original shape and thickness of the compressible components, and may also be able to enable the connector to float in any two directions.

Float bracket 312 includes openings 610 and a bar 612. Similarly, float bracket 314 includes openings 620 and a bar 622. In an example, receptacle 602 and compressible component 606 may be inserted within openings 610 to interface connector 310 with float bracket 312. Similarly, receptacle 604 and compressible component 608 may be inserted within openings 620 to interface connector 310 with float bracket 312. A resting or auto-centered position of connector 310 may include compressible component 606 to be in physical communication with bar 612 and compressible component 608 to be placed in physical communication with bar 622. A cross section of floating connector assembly 204 taken along line A-A in FIG. 6 is illustrated in FIG. 7.

Figure 7:
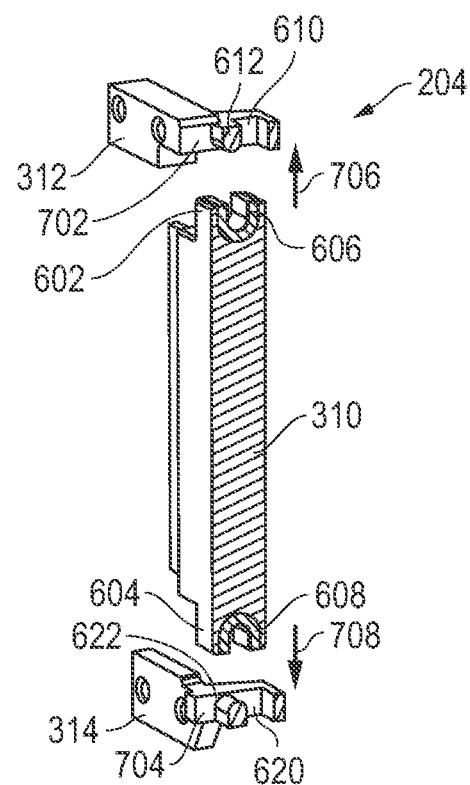
FIG. 7 is a cross sectional view of the floating connector assembly, the floating brackets and the cable connector according to at least one embodiment of the present disclosure.

Referring now to FIG. 7, float bracket 312 includes a backing surface 702, and float bracket 314 includes a backing surface 704. Backing surface 702 may be placed in physical communication with receptacles 602 and backing surface 704 may be placed in physical communication with receptacle 604. In an example, backing surfaces 702 and 704 may provide rigid support for receptacles 602 and 604 from an insertion force is exerted on connector 310 when cable or other connector is plugged into the connector.

In certain examples, bars 612 and 622 may be in any suitable shape. For example, a portion of bar 612 towards connector 310 may be substantially the same shape as receptacle 602, such as 'U' shaped. Similarly, a portion of bar 614 towards connector 310 may be substantially the same shape as receptacle 604, such as 'U' shaped. Based on bars 612 and 614 being substantially the same shape as receptacles 602 and 604, connector 310 may be auto-centered within floating connector assembly 204.

In an example, floating connector assembly 204 may be connected together in any suitable manner. For example, one of float brackets 312 and 314 may be secured to a side cover of an information handling system, such as side cover 302 of information handling system 200 in FIG. 3, and the other float bracket may be placed in physical communication with connector 310. In an example, float bracket 314 may be secured to the side cover at any point, such as the float bracket may be pre-assembled into information handling system 200.

Connector 310 may be placed in physical communication with float bracket 312 by in the direction of arrow 706, and receptacle 602 may be inserted through openings 610 until compressible component 606 is placed in physical communication with bar 612. Connector 310 and float bracket 312 may be moved in the direction of arrow 708 until receptacle 604 is inserted into openings 620 of float bracket 314. In response to connector 310 being in physical communication with both float brackets 314 and 314, float bracket 312 may be secured to the side cover. Based on connector 310 being in physical communication with both brackets 312 and 314, floating connector assembly 204 may be fully connected together as shown in FIG. 8.

Figure 8:
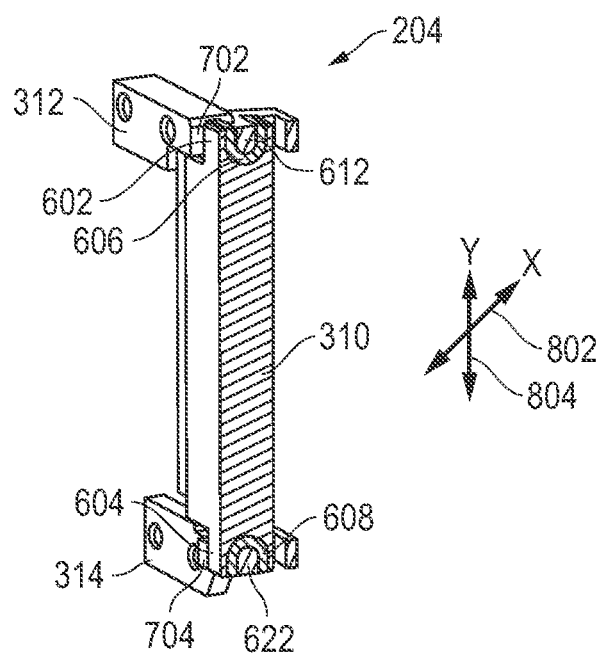
FIG. 8 is a cross sectional view of the floating connector assembly with the floating brackets mated with the cable connector according to at least one embodiment of the present disclosure.

Referring now to FIG. 8, compressible components 606 and 608 within respective receptacles 602 and 604 may allow connector 310 to float in x and y directions as illustrated by arrows 802 and 804, but may prevent movement of the connector in the z direction. In an example, the float or movement of connector 310 in the two directions may allow components with different alignment tolerances to plug into the connector, and the rigidity of receptacles 602 and 604 in the third direction may provide a backing for force applied to connector 310 when the components are inserted.

In an example, the different alignment tolerances may be caused by any suitable differences in components plugged into connector 310. For example, the alignment of one component may be slightly off from the center position of connector 310 in the 'x' direction indicated by arrow 802, the 'y' direction indicated by arrow 804, or a combination of both the 'x' and 'y' directions. Alignment of another component may be off from the center position of connector 310 in a direction that is different from the first component. Compressible components 606 and 608 may enable to connector 310 to move within floating connector assembly 204 as shown in FIG. 9.

Figure 9:
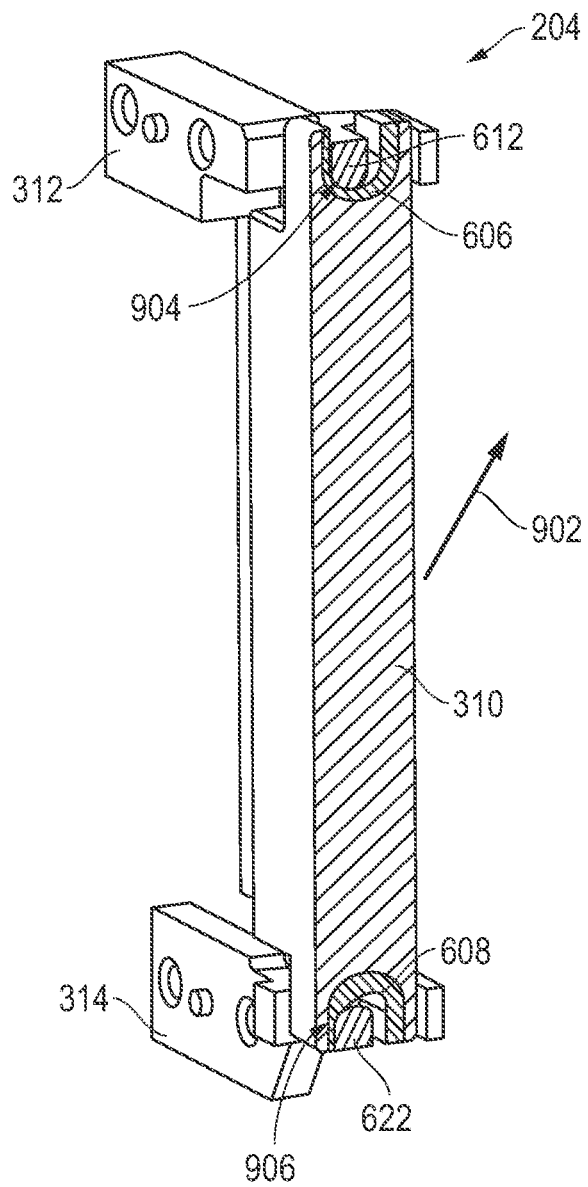
FIG. 9 is a cross sectional view of the floating connector assembly with the cable connector compressing a portion of the floating brackets according to at least one embodiment of the present disclosure.

Referring to FIG. 9, if a component being plugged into connector 310 is not completely aligned with the center position of the connector, compressible components 606 and 608 may enable the connector to float in any direction to allow proper alignment. For example, a force of a component being inserted within connector 310 may cause the connector to move or float in the direction of arrow 902. In this example, the force exerted by the component may cause bar 612 of float bracket 312 to compress compressible material 606 at a region 904 and bar 622 of float bracket 314 to compress compressible material 608 at a region 906.

In an example, floating connector assembly 204 may remain in the position of shown in FIG. 9 while the component is plugged into the connector 310. When the component is removed or unmated with connector 310, region 904 of compression component 606 may be uncompressed and region 906 of compression component 608 may be uncompressed. In response to the force of the component being removed, compression components 606 and 608 may reform to its original size, and connector 310 may be auto-centered within floating connector assembly 204.

While floating connector assembly 204 has been shown and described in a vertical orientation, one of ordinary skill in the art would recognize that the floating connector assembly may be positioned in any direction, such as a horizontal position, and operate as disclosed above and without varying from the scope of this disclosure.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A floating connector assembly for an information handling system, the floating connector assembly comprising:

a first float bracket including a first bar and a backing surface; and a connector including a first receptacle lined with a first compressible component, the first compressible component to be placed in physical communication with the first bar of the first float bracket, a region of the first compressible component to compress in response to a force exerted on the connector, the connector to float with respect to the first float bracket in X and Y directions based on the force exerted on the connector and the backing surface prevents the connector to float in a Z direction.

2. The floating connector assembly of claim 1, wherein:
a second float bracket including a second bar; and
the connector including a second receptacle and a second compressible component, the second compressible component to be placed in physical communication with the second bar of the second float bracket, a region of the second compressible component to compress in response to the force exerted on the connector, the connector to float with respect to the second float bracket in the direction of the force exerted on the connector.

3. The floating connector assembly of claim 1, wherein the first receptacle includes a first end and a second end, the first end is connected to the connector, and the second end is an open shape.

4. The floating connector assembly of claim 3, wherein the first compressible component is the same open shape as the second end of the first receptacle.

5. The floating connector assembly of claim 1, wherein the region of the first compressible component is uncompressed in response to the force being removed.

6. The floating connector assembly of claim 5, wherein the first compressible component reforms to an original shape in response to the force being removed.

7. The floating connector assembly of claim 6, wherein the first compressible component holds the connector in an auto-centered position when the first compressible component is in the original shape.

8. The floating connector assembly of claim 1, wherein the first bar forms one or more openings within the first float bracket, and the openings to receive the first receptacle when the first compressible component is placed in physical communication with the first bar of the first float bracket.

9. An information handling system comprising:
a server including a side cover; and
a floating connector assembly in physical communication with the side cover of the server, the floating connector assembly including:
  a first float bracket including a first bar, the first float bracket secured to the side cover; and
  a connector including a first receptacle lined with a first compressible component, the first compressible component to be placed in physical communication with the first bar of the first float bracket, a region of the first compressible component to compress in response to a force exerted on the connector, and the connector to float with respect to the first float bracket in a direction of the force exerted on the connector.

10. The information handling system of claim 9, wherein the floating connector assembly further includes:
a second float bracket including a second bar; and
the connector including a second receptacle and a second compressible component, the second compressible component to be placed in physical communication with the second bar of the second float bracket, a region of the second compressible component to compress in response to the force exerted on the connector, the connector to float with respect to the second float bracket in the direction of the force exerted on the connector.

11. The information handling system of claim 10, wherein the second float bracket is secured to the side cover when the connector is in physical communication with both the first and second float brackets.

12. The information handling system of claim 9, wherein the first receptacle includes a first end and a second end, the first end is connected to the connector, and the second end is an open shape.

13. The information handling system of claim 12, wherein the first compressible component is the same open shape as the second end of the first receptacle.

14. The information handling system of claim 9, wherein the region of the first compressible component to is uncompressed in response to the force being removed.

15. The information handling system of claim 14, wherein the first compressible component reforms to an original shape in response to the force being removed.

16. The information handling system of claim 15, wherein the first compressible component holds the connector in an auto-centered position when the first compressible component is in the original shape.

17. The information handling system of claim 9, wherein the first bar forms one or more openings within the first float bracket, and the openings to receive the first receptacle when the first compressible component is placed in physical communication with the first bar of the first float bracket.

18. An information handling system comprising:
a server including a side cover;
a midplane; and
a floating connector assembly in physical communication with the side cover of the server, the floating connector assembly including:
  a first float bracket including a first bar, the first float bracket secured to the side cover; and
  a connector including a first receptacle lined with a first compressible component, the connector in communication with the midplane, the first receptacle including a first end and a second end, the first end being connected to the connector, and the second end being an open shape, the first compressible component to be placed in physical communication with the first bar of the first float bracket, a region of the first compressible component to compress in response to a force exerted on the connector, the connector to float with respect to the first float bracket in a direction of the force exerted on the connector, wherein the region of the first compressible component is uncompressed in response to the force being removed.

19. The information handling system of claim 18, wherein the first compressible component reforms to an original shape in response to the force being removed.

20. The information handling system of claim 19, wherein the first compressible component holds the connector in an auto-centered position when the first compressible component is in the original shape.

* * * * *